United States Patent [19]

Hedgcoth

[11] Patent Number: 5,073,245

[45] Date of Patent: Dec. 17, 1991

[54] SLOTTED CYLINDRICAL HOLLOW CATHODE/MAGNETRON SPUTTERING DEVICE

[76] Inventor: Virgle L. Hedgcoth, 1524 Hacienda Pl., Pomona, Calif. 91768

[21] Appl. No.: 550,719

[22] Filed: Jul. 10, 1990

[51] Int. Cl.[5] ............................................. C23C 14/34
[52] U.S. Cl. ......................... 204/298.21; 204/298.12; 204/298.23; 204/192.12
[58] Field of Search ...................... 204/192.12, 298.09, 204/298.12, 298.16, 298.17, 298.18, 298.19, 298.21, 298.23

[56] References Cited

U.S. PATENT DOCUMENTS

| | | | |
|---|---|---|---|
| 2,146,025 | 2/1939 | Penning | 204/298 |
| 3,616,450 | 10/1971 | Clark | 204/298 |
| 3,619,402 | 11/1971 | Wurm et al. | 204/298.12 |
| 3,711,398 | 1/1973 | Clarke | 204/298 |
| 3,878,085 | 4/1975 | Corbani | 204/298.21 X |
| 3,884,793 | 5/1975 | Penfold et al. | 204/298.16 |
| 4,126,530 | 11/1978 | Thornton | 204/298 |
| 4,132,613 | 1/1979 | Penfold et al. | 204/298 |
| 4,166,018 | 8/1979 | Chapin | 204/298 |
| 4,290,877 | 9/1981 | Blickensderfer | 204/298 |
| 4,356,073 | 10/1982 | McKelvey | 204/298 |
| 4,442,916 | 12/1983 | McKelvey | 204/298 |
| 4,472,259 | 9/1984 | Class et al. | 204/298 |
| 4,622,121 | 11/1986 | Wegmann et al. | 204/298.18 |
| 4,915,805 | 4/1990 | Rust | 204/298.16 X |
| 4,933,057 | 6/1990 | Sebastiano et al. | 204/298.12 |

OTHER PUBLICATIONS

"Tubular Hollow Cathode Sputtering Onto Substrates of Complex Shape", Thornton et al., 9-16-74.
"Cylindrical Magnetron Sputtering", Thornton et al., from Thin Film Processes, 1978.
"Plasmas in Deposition Processes", John A. Thornton, reproduced from Deposition Technologies for Films and Coatings Developments and Applications, Bunshaw et al., 1982.
"C-Mag Rotatable Magnetron Cathode", Hofman, Airco Coating Technology brochure (date unknown).

Primary Examiner—Nam X. Nguyen
Attorney, Agent, or Firm—Joseph C. Andras

[57] ABSTRACT

A magnetron sputtering device for coating planar substrates with sputtered ions. The sputtering occurs from the internal wall of a cylindrical hollow flanged cathode target that includes a slot longitudinally disposed in a sidewall of the cathode. A first portion of sputtered atoms travel through the slot and onto a planar substrate moving relative to the sputtering device and a second portion of sputtered atoms simply redeposit on the internal wall of the cathode target such that the target cathode evenly erodes.

9 Claims, 6 Drawing Sheets

SLOTTED CYLINDRICAL HOLLOW CATHODE/MAGNETRON SPUTTERING DEVICE

BACKGROUND OF THE INVENTION

1. Field of the Invention

This invention relates generally to electrode type glow discharge devices used in the field of thin film deposition and, more particularly, to an improved magnetron sputtering device that may be used for sputtering planar substrates in a continuous pass-by mode.

2. Description of Related Art

Sputtering is a well known technique for applying a thin film of material to a substrate. The process involves placing a "target" comprised of or coated with the material to be sputtered into a chamber containing a low pressure gas. The material to be sputtered is ejected from the target by connecting the target as a cathode and creating a low pressure gas discharge between the target and a nearby anode. A negative voltage is applied to the cathode at a high current level so that gas ions bombard its surface with high energy and thereby eject (sputter) atoms that will deposit on the substrate. The process is self-sustaining because many of the incident gas ions, rather than ejecting an atom of the material to be sputtered, create a shower of electrons that collide with neutral gas atoms and create even more gas ions.

The general concept of cathodic sputtering is set forth in great detail in U.S. Pat. No. 2,146,025, issued to Penning on Feb. 7, 1939. After Penning, the advances in sputtering were few until the early sixties when, contrary to earlier thought, it was theoretically shown that sputtering was primarily due to momentum transfer between the incident ions and the target. This new theory soon led to a variety of sputtering devices having different geometries and using magnetic fields of various shapes to direct and guide the gas discharge. Such devices are generally known as magnetron sputtering devices.

For example, U.S. Pat. No. 3,884,793, issued to Penfold et al. on May 20, 1975, discloses a magnetron sputtering device having either a solid or hollow cylindrical target and using a magnetic field that is parallel to the long axis of the cylindrical surface to maintain the gas discharge near the surface of the target. Although the Penfold et al. device was an advancement in the field, its efficient use was limited to the sputtering of long cylindrical substrates such as wires or optical fibers.

Two other patents of interest, U.S. Pat. No. 3,616,450, issued to Clarke on Oct. 26, 1971, and U.S. Pat. No. 3,711,398 also issued to Clarke on Jan. 16, 1973, relate to magnetron sputtering devices having target and magnetic field geometries that make them best suited for the sputtering of silicon wafers and the like. The devices disclosed by Clarke use a cylindrical cathode with a plurality of permanent magnets disposed circumferentially around the cathode. The magnetic field of the Clarke devices pierce the cylindrical cathode in such a way that a toroidal gas discharge occurs along a portion of the cathode's interior. The Clarke devices are undesirable because the size and shape of the work pieces that may be sputtered are limited by the fact that sputtered atoms can only escape from the end of the cylinder. This spot-source mode of operation limits the device to stationary or batch-type usages rather than continuous pass-by usage. Moreover, the cathode must be replaced before it is completely used up because the gas discharge occurs along a limited portion of its surface.

At least two inventors approached the cathode geometry problem with planar substrates in mind. In particular, U.S. Pat. No. 3,878,085, issued to Corbani on Apr. 15, 1975, and U.S. Pat. No. 4,166,018, issued to Chapin on Aug. 28, 1979, both disclose sputtering devices that use a substantially planar cathode along with magnetic flux lines that bisect the planar cathode. In the preferred embodiments of both inventors, the magnetic flux lines are created so as to define a "race track" like tunnel on the surface of the cathode. The Corbani/Chapin devices are very suited to coating planar substrates. However, like the Clarke devices, the cathodemagnetic field geometry is such that the cathode wears unevenly beneath the magnetic "race track."

It was the problem of uneven cathode erosion that led to U.S. Pat. Nos. 4,356,073 and 4,422,916, both issued to McKelvey on Oct. 26, 1982 and Dec. 27, 1983, respectively. McKelvey, like Corbani and Chapin, uses a magnetic field that bisects the cathode in order to maintain the glow discharge on the surface of the cathode. However, McKelvey used a cylindrical cathode rather than a planar cathode. McKelvey's solution to uneven erosion is to mechanically rotate the cylindrical cathode around a plurality of permanent magnets arranged longitudinally within the cathode. Although the McKelvey device solves the problem of uneven cathode erosion, it leads to further problems. Specifically, it requires additional drive components that are both costly and, like all mechanical things, prone to breaking down. Minimizing mechanical down time is particularly important where the sputtering device forms part of an assembly line, such as a mill-type environment architectural glass or magnetic media.

SUMMARY OF THE INVENTION

The present invention is directed towards a new and different magnetron sputtering device that is suitable for depositing a thin film of sputtered material onto a substantially planar substrate. Unlike the prior art devices, the present invention provides such a magnetron sputtering device with a cathode that wears evenly during operation and without requiring any moving parts.

According to the invention, the magnetron sputtering device is comprised of a hollow longitudinal cathode means that is either made from or has its interior wall coated with the material to be sputtered. A longitudinal wall of said cathode means defines an elongated hollow central portion in which sputtering may occur and further defines a longitudinal aperture from which sputtered material may exit. An anode is placed in proximity of the cathode and a power supply is used to apply a negative potential to the cathode in order to initiate and maintain a glow discharge between the cathode and the anode. A magnetic means is used to provide magnetic flux lines that are substantially parallel to the longitudinal axis of the cathode and contiguous with the interior wall. The magnetic flux lines ensure that the glow discharge occurs near and along all portions of the cathode's interior wall such that high current densities may be achieved and so that even wear of the cathode surface occurs. A first portion of the sputtered material will escape from the longitudinal slot and be available for coating a substantially planar work piece that is moved by the slot. A second portion of the sputtered material will recollect on the interior of the cathode and again be available for sputtering.

These and other benefits of the invention will be made more apparent from the following detailed description of the preferred embodiment taken together with the drawings.

DESCRIPTION OF THE PREFERRED EMBODIMENT

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a slotted cathode magnetron sputtering device.

Figure 2:
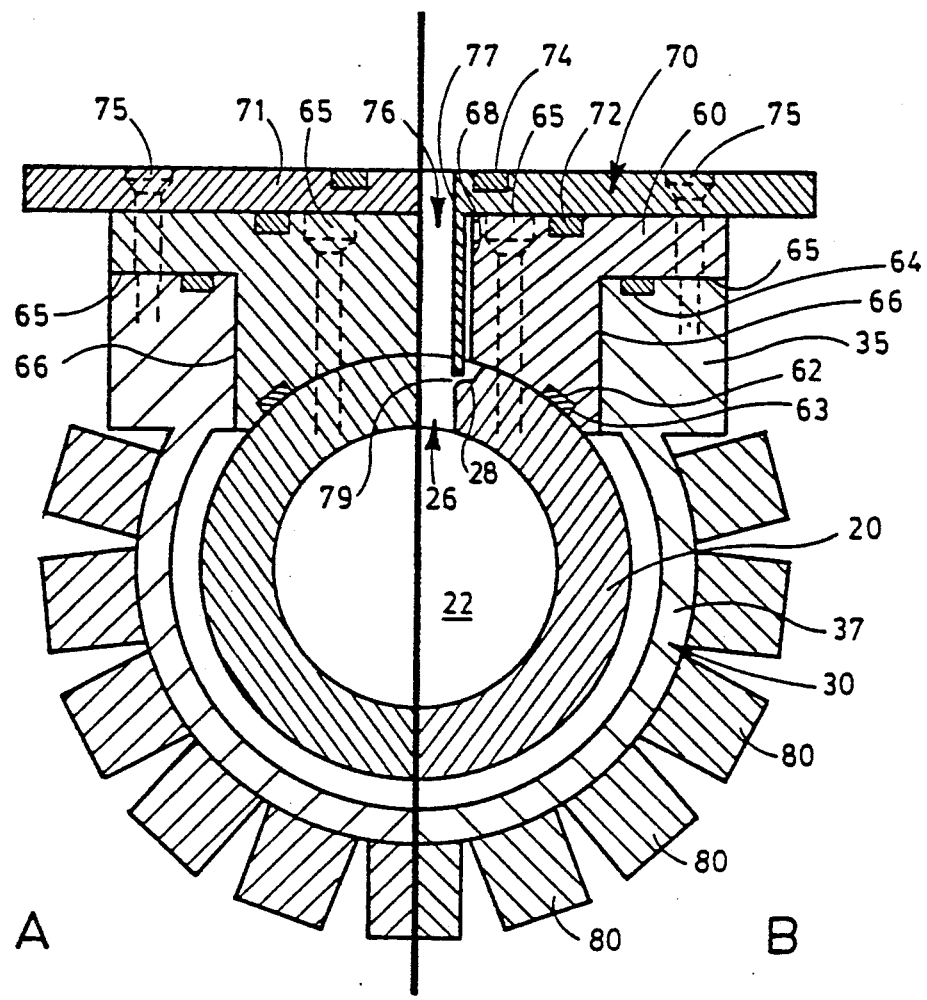
FIG. 2 is a radial cross-section of the device of FIG. 1.
Figure 3:
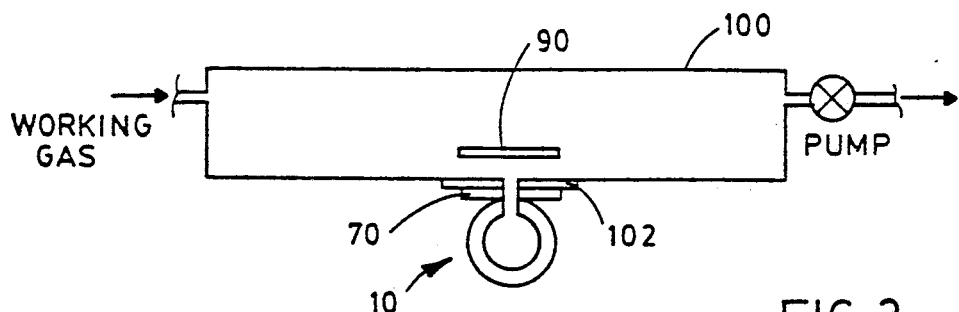
FIG. 3 is a diagrammatic elevational end view of the device of FIGS. 1 and 2 positioned within a vacuum chamber 100 and below a moving planar substrate 90 to be coated.
Figure 4C:
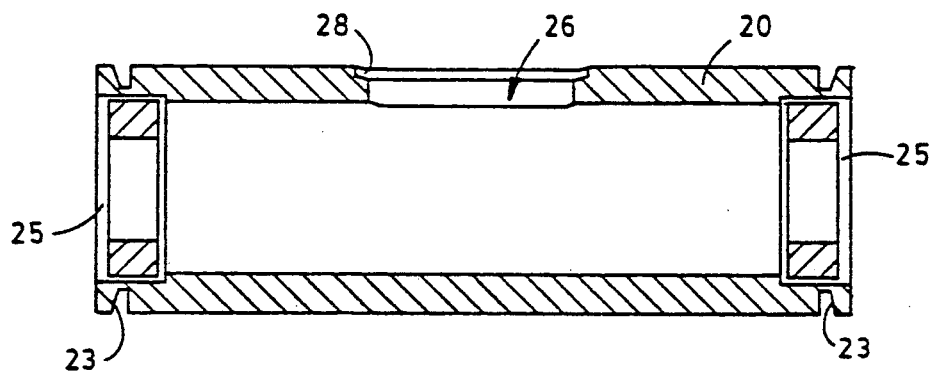
FIGS. 4a, 4b, and 4c are a top view, a sectional side view, and an end view, respectively, of a cylindrical cathode member 20 and cathode wings 25 according to the present invention.
Figure 4A:
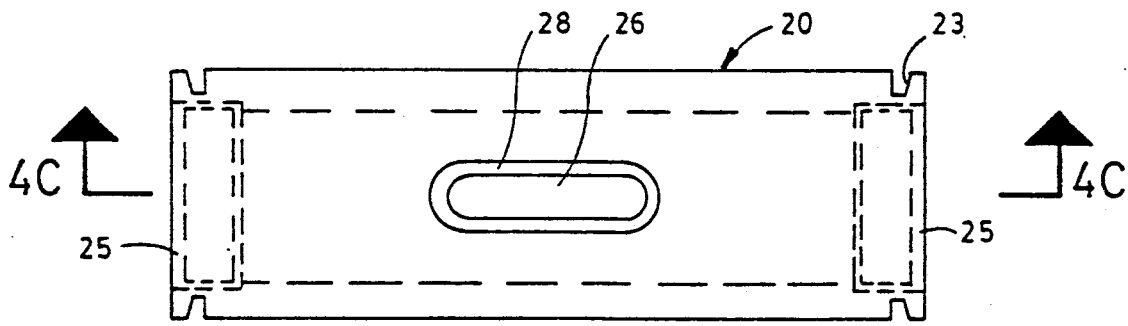
Figure 4B:
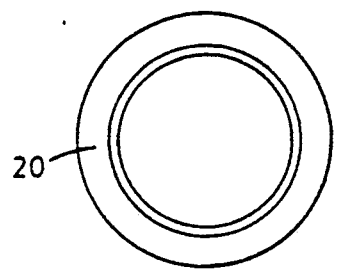
Figure 5A:
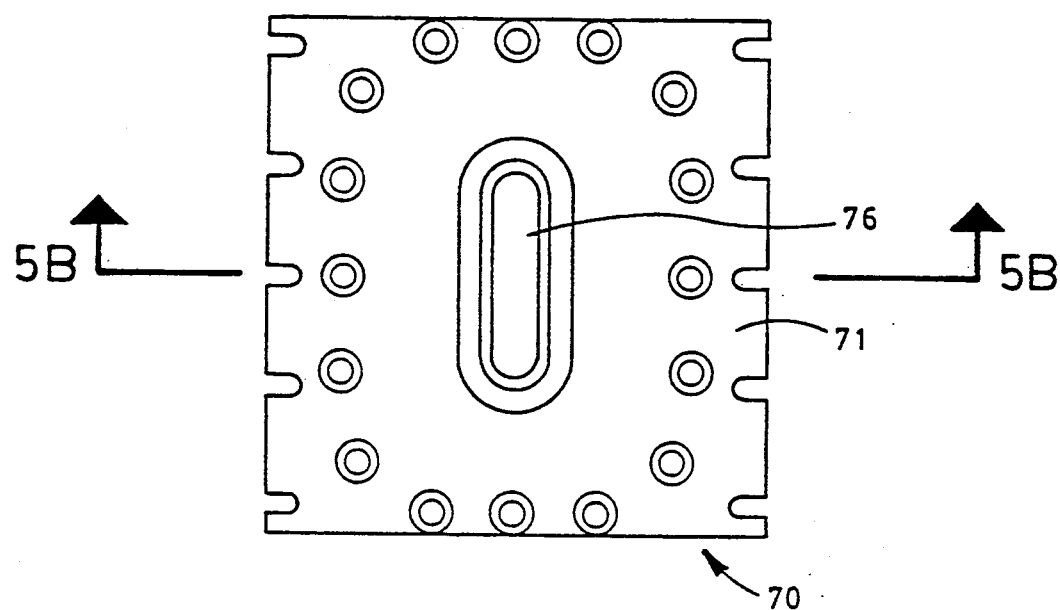
FIGS. 5a and 5b are a top view and a sectional side view, respectively, of a flange member 70 according to the present invention.
Figure 5B:
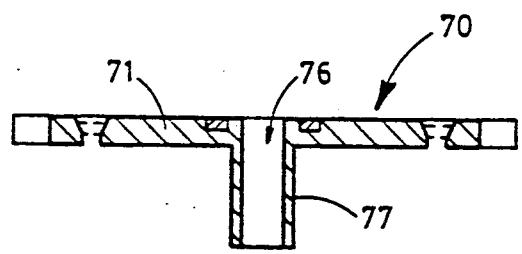
Figure 6A:
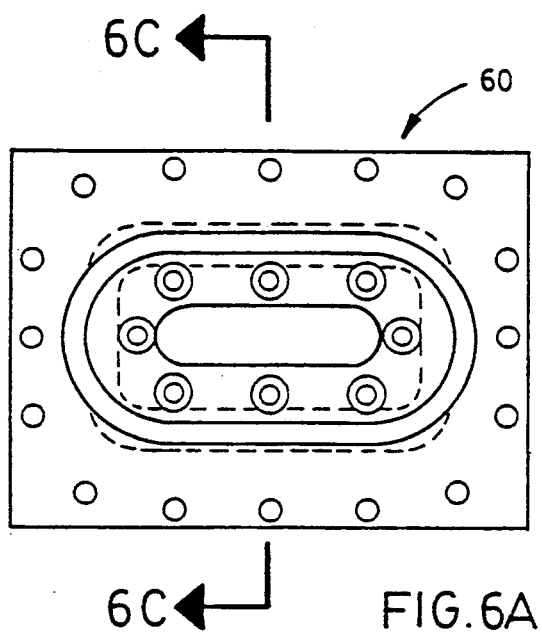
FIGS. 6a, 6b, and 6c are a top view, a side view, and a sectional end view, respectively, of an insulator 60 according to the present invention.
Figure 6C:
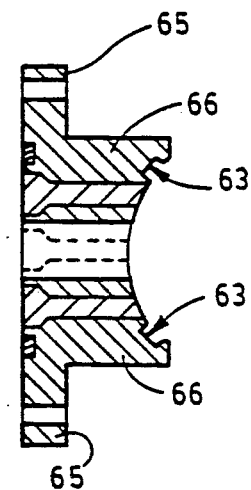
Figure 6B:
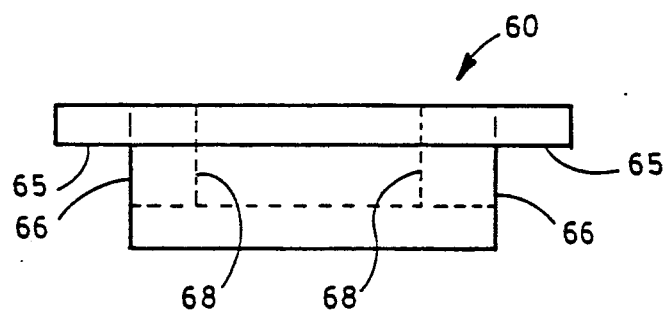
Figure 7A:
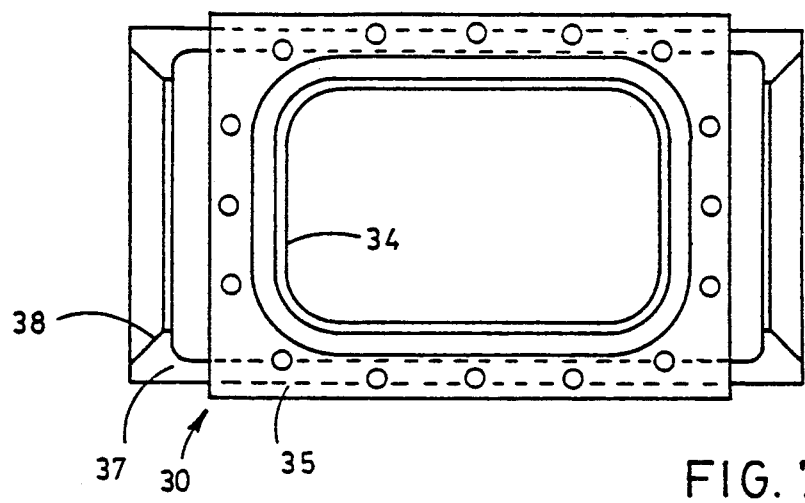
FIGS. 7a, 7b, and 7c are a top view, a side view, and an end view, respectively, of a water jacket 30 according to the present invention.
Figure 7B:
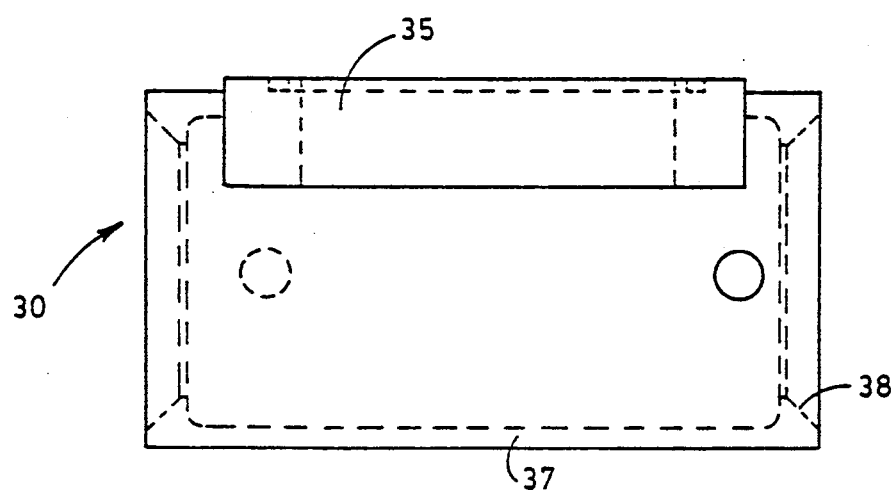
Figure 7C:
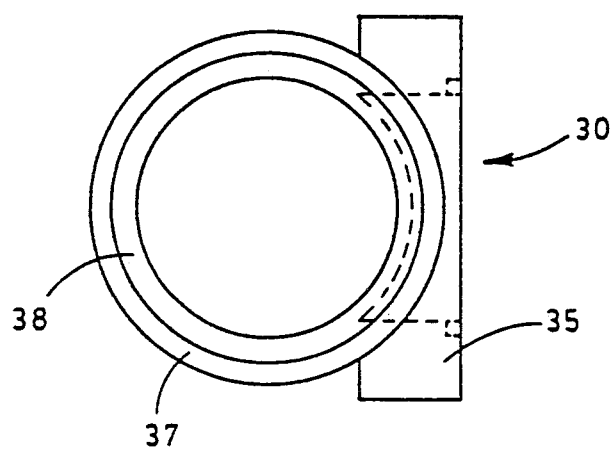

FIG. 3 is a schematic cross-sectional end view of a vacuum chamber 100 having a magnetron sputtering device 10 according to the present invention mounted to a support flange 102 carried by the chamber 100. A planar substrate 90 is placed adjacent to the magnetron sputtering device 10 in order to coat the substrate 90 with sputtered atoms 12 that are emitted from a slot in the side of the magnetron sputtering device. The substrate 90 may be stationary or, as represented by an arrow in FIG. 3, the substrate 90 may be moved relative to the magnetron sputtering device in order to coat a larger area. The actual construction of the preferred embodiment is best understood with reference to FIGS. 1 and 2, and in particular, with reference to component FIGS. 4 through 7.

A preferred magnetron sputtering device 10 is comprised of a cylindrical cathode member 20 having a wall configuration that defines a sputtering cavity 22 and a cathode slot 26. As is well known in the prior art, the cathode member 20 is either constructed of or coated with at least one material to be sputtered. Where a metal is to be sputtered, the device is generally operated with DC current as known in the art. Alternatively, RF energy may be used when a nonmetal is to be sputtered.

In the preferred embodiment, the cylindrical cathode member 20 is removably attached to a pair of annular cathode wings 25, one cathode wing 25 being threaded into each end of the cylindrical cathode member 20. The annular cathode wings 25 combine with the cylindrical cathode member 20 to define a hollow flanged cathode similar to that disclosed in U.S. Pat. No. 3,884,793 issued to Alan Penfold and John Thornton on May 20, 1975, the disclosure of which is incorporated by reference as if fully set forth herein. This novel, multi-component construction of a hollow flanged cathode provides a cathode target (cathode member 20) that may be cost effectively manufactured and easily replaced.

A pair of anodes 40 are positioned near the cathode wings 25 and on either side of the cathode member 20. In order to provide a continuous circuit for maintenance of a glow discharge, the anodes 40 include end portions 46 that are exposed to the sputtering cavity 22 through the annular cathode wings 25. The anodes 40 are releasably fastened to the cylindrical cathode member 20 with clamps 41 that engage an anode shoulder 43 and an annular slot 23 defined on each end of the cathode member 20. A pair of annular insulators 44 are disposed between the cathode member 20 and each anode 40 to prevent direct electrical contact therebetween and a pair of O-rings 42 are used to seal anodes 40 against the cathode member 20. It is understood that the exact interrelationship between the anodes 40 and the hollow flanged cathode defined by the cathode member 20 and the cathode wings 25 may be other than as defined herein and, since U.S. Pat. No. 3,884,793 sets forth such relationship in great detail, the herein description has been simplified.

Figure 1:
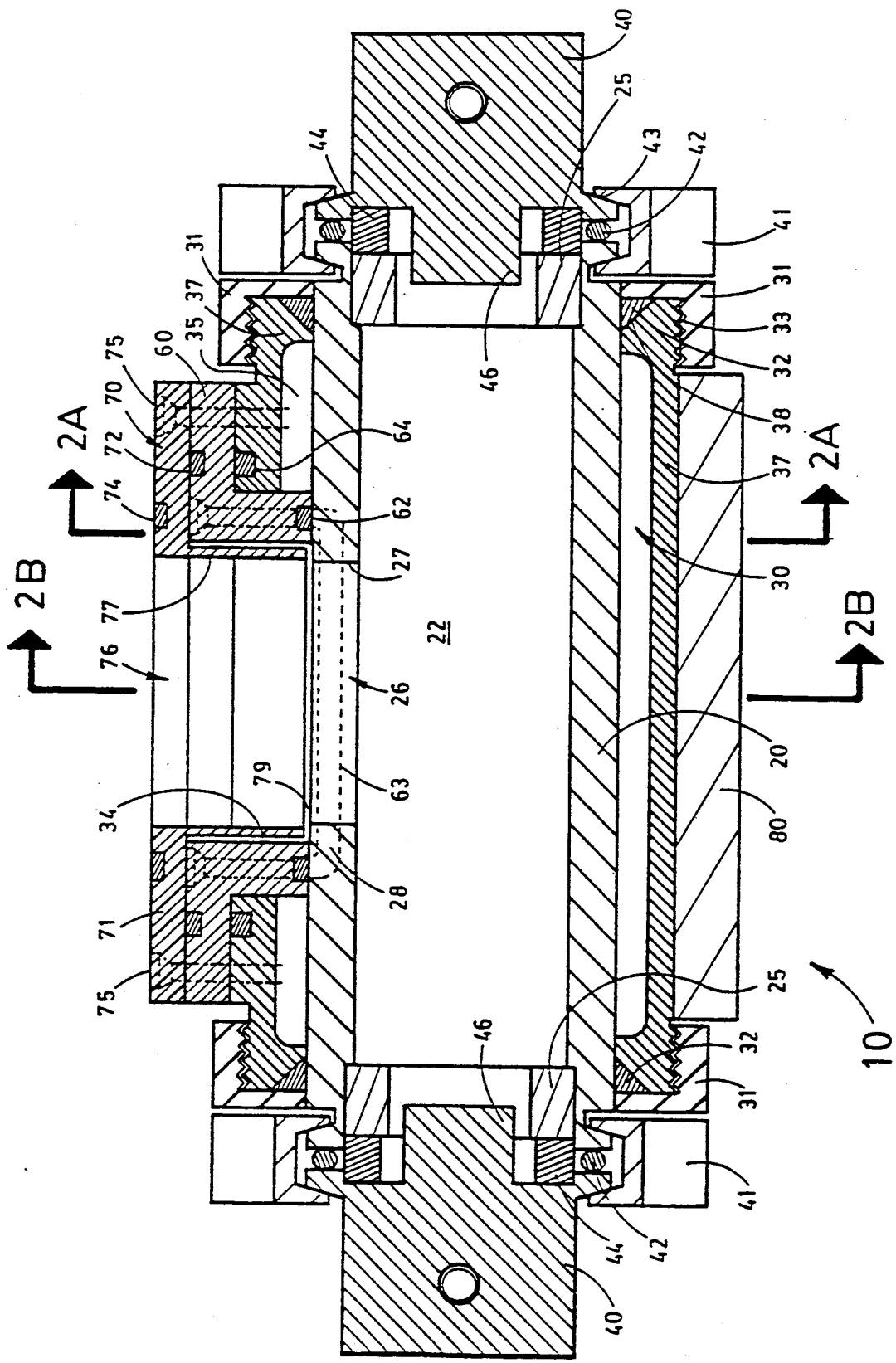
FIG. 1 is an axial cross-section of a preferred magnetron sputtering device according to the present invention.

As suggested by FIG. 3, a slotted flange member 70 is provided for mounting the sputtering device 10 to a support flange 102 (mounting means not shown). The flange member 70 is preferably constructed of aluminum or stainless steel. Referring to FIGS. 1 and 2, the flange member 70 includes an upper plate 71 and a lip 77 that extends downwardly therefrom. The lip 77 defines a flange slot 76 that is substantially inline with the cathode slot 26 when the sputtering device 10 is assembled. An O-ring 74 is provided to make a good seal around the periphery of the flange slot 76 and between the exterior of the support flange 102 and the upper surface of the upper plate 71.

A slotted insulator 60 is connected to the slotted flange member 70 at the underside of the flange plate 71 with fasteners 75. The cathode member 20 itself is then connected to the insulator 60 with fasteners 65. As shown in FIG. 2, the insulator 60 includes a slot 68 through which the lip 77 of the flange member 70 may extend. In order to isolate the cathode slot 26 from a water jacket 30 (described further herein) carried by the insulator 60, the insulator 60 includes a channel 63 along a surface of the insulator 60 that surrounds cathode slot 26. A cathode slot O-ring 62 is placed in the channel 63 and then compressed against the cathode member around the perimeter of cathode slot 26 with the fasteners 65.

The cathode member 20 is encased within a water jacket 30 in order to provide the necessary cooling. The water jacket 30 should be comprised of a material that is a good electrical insulator such as ceramic, nylon, teflon, Delrin, or polyvinylchloride (PVC).

The water jacket 30 is comprised of a mounting block 35 and a cylindrical member 37 and, like the insulator 60, is supported from the flange member 70 by the fasteners 75. In particular, the mounting block 35 has an internal aperture that is sized to engage a horizontal peripheral wall 65 and a an upper surface that engages a vertical peripheral wall 66 of the insulator 60. The mounting block 35 is connected to the horizontal peripheral wall 65 of the insulator 60 with the fasteners 75.

The cylindrical member 37, carried by the mounting block 35, includes a slot 34 through which the lip 77 of the flange member 70 may pass. A pair of end-nuts 31 are placed around the cylindrical cathode member 20 and screwed onto threads 33 carried at opposite ends of the cylindrical member 37. In order to create a water tight seal, the end-nuts 31 compress a pair of O-rings 32 between the outer wall of the cathode member 20 and internal frusto-conical edges 38 provided at opposite ends of the water jacket cylindrical member 37.

A plurality of longitudinal permanent bar magnets 80 are disposed about most of the perimeter of the water jacket 30 so as to provide the desired magnetic flux lines within the sputtering cavity 22 of the cathode member 22. As disclosed in U.S. Pat. No. 3,884,793 the magnetic flux lines run longitudinally and substantially parallel to the interior wall of the cylindrical cathode 20 and thereby create a magnetic trap for the glow discharge that occurs in the sputtering cavity 22 of the cathode member 20.

The bar magnets may of course be placed in other positions without departing from the teachings of the present invention. For example, the bar magnets 80 may be placed on the interior of the water jacket 30. Moreover, electromagnets may be substituted if desirable.

Returning to the flange member 70, an important feature of the lip 77 is that it extends beyond the insulating water jacket 30 and adjacent to, but not touching, a shoulder 28 that surrounds the cathode slot 26. The lip 77 is of such dimension that a gap 79 is present between the lip 77 and the cathode shoulder 28. The gap 79 is designed to be smaller than the dark space associated with the glow discharge so that no glow discharge occurs between the cathode shoulder 28 and the lip 77. Thus, no short circuit is created by the glow discharge connecting the cathode member 20 to the conductive lip 77. Moreover, because little or no sputtered atoms collect in the gap 79, the sputtered material may collect on the interior vertical wall of the lip 77 with little risk of creating a short circuit between the cathode member 20 and the conductive flange member 70 which is fastened to the typically conductive mounting flange 102. It is contemplated that the sputtered material may be periodically removed from the vertical wall of the lip 77 by scraping or the like. In the preferred embodiment, the interior wall of the lip 77 is mechanically roughened (not shown) to minimize the frequency of needed maintenance by increasing the surface area thereon for collection of sputtered atoms.

When a glow discharge is initiated within the cylindrical cavity 22, atoms will begin to sputter from the interior wall of cathode 20. A portion of the sputtered atoms will be ejected from the wall at an angle that will result in their being transmitted through cathode slot 26 and flange slot 76 onto the substrate 90 adjacent to or being moved by the magnetron sputtering device 10. A second portion of the sputtered atoms will simply redeposit on the interior of the cylindrical cathode 20 and again be available for later sputtering.

Typical operating parameters for a magnetron sputtering device according to the present invention are as follows:
inert gas pressure range: 1-50 microns
discharge voltage: 250-1500 volts
current density: 0-300 mA/cm$^2$
magnetic field strength: 150-300 gauss
typical working gas: Argon, Krypton, or Xenon Another important feature of the present invention is that sputtering will occur substantially evenly from all of the interior surfaces of the cylindrical cathode 20. The cathode will therefore have a comparatively long life because, on average, the atoms will be evenly sputtered from all of the cathode member's interior and then, on average, uniformly recollect thereon. Increased cathode life is particularly important where the magnetron sputtering device is used in an assembly line environment where production shut down is costly and where, before the present invention, cathode replacement was both difficult and time consuming.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A cathode target for use in sputtering a material, comprising:

a unitary hollow longitudinal member having a wall with an interior surface, at least the interior surface of the wall being comprised of the material to be sputtered;

magnetic means for providing magnetic flux lines within the interior and substantially parallel to the longitudinal axis of the hollow longitudinal member, said magnetic flux lines being substantially contiguous to all portions of the interior wall such that an electron plasma may be contained adjacent to substantially to all portions of the interior wall during the sputtering process; and an aperture disposed in the wall of the hollow longitudinal member whereby some of the atoms sputtered from the interior surface of the hollow longitudinal member will travel through the aperture and other of the atoms sputtered from the interior surface of the hollow longitudinal member will redeposit on the interior of the hollow longitudinal member.

2. The cathode target of claim 1 wherein the aperture is a longitudinal slot.

3. The cathode target of claim 1 wherein the hollow longitudinal member is circular in cross-section.

4. The cathode target of claim 3 wherein the aperture is longitudinally disposed in the wall of the hollow longitudinal member.

5. The cathode target of claim 1 wherein the hollow longitudinal member is entirely comprised of the material to be sputtered.

6. A magnetron sputtering device for sputtering a thin film of a material onto a substrate moving relative to the sputtering device, comprising:

a hollow longitudinal cathode means having a longitudinal wall from which the material is to be sputtered, the longitudinal wall of said cathode means defining an elongated hollow central portion in which sputtering may occur and further defining a longitudinal aperture from which sputtered material may exit;

an anode means in proximity to said cathode means;

power supply means for creating an electric field between said cathode means and said anode means; and magnetic means for providing magnetic flux lines within the hollow central portion of said cathode means, the magnetic flux lines being substantially parallel to the longitudinal axis of said cathode means and substantially contiguous to the longitudinal wall of said cathode means so as to trap electrons substantially adjacent to all portions thereof;

whereby a first portion of the material sputtered within the interior of said cathode means is ejected through the longitudinal aperture onto the substrate and a second portion of the material sputtered within the interior of said cathode means is collected on the longitudinal wall of said cathode means and again available for sputtering.

7. The magnetron sputtering device of claim 6 the magnetic means is comprised of permanent bar magnets longitudinally aligned with the hollow longitudinal cathode means.

8. The magnetron sputtering device of claim 6 further comprising a water jacket surrounding the hollow longitudinal cathode means.

9. The magnetron sputtering device of claim 5 wherein hollow longitudinal cathode means is circular in cross-section.

* * * * *